United States Patent [19]
Walton

[11] Patent Number: 4,843,313
[45] Date of Patent: Jun. 27, 1989

[54] INTEGRATED CIRCUIT PACKAGE CARRIER AND TEST DEVICE

[75] Inventor: R. Thomas Walton, Torrance, Calif.

[73] Assignee: Hughes Aircraft Company, Los Angeles, Calif.

[21] Appl. No.: 686,324

[22] Filed: Dec. 26, 1984

[51] Int. Cl.⁴ .................... G01R 31/02; H01R 9/09
[52] U.S. Cl. .................... 324/158 F; 324/158 P; 439/66; 439/91
[58] Field of Search .............. 324/158 F, 158 P; 339/17 CF; 174/52 FP; 206/328; 439/66, 91, 260, 591, 931

[56] References Cited

U.S. PATENT DOCUMENTS

| | | | |
|---|---|---|---|
| 4,118,092 | 10/1978 | Sado et al. | 339/17 CF |
| 4,402,561 | 9/1983 | Grabbe et al. | 339/17 CF |
| 4,506,938 | 3/1985 | Madden | 324/158 F |
| 4,593,961 | 6/1986 | Cosmo | 339/17 CF |

*Primary Examiner*—Ernest F. Karlsen

*Attorney, Agent, or Firm*—Leonard A. Alkov; A. W. Karambelas

[57] ABSTRACT

A carrier and test device for an integrated circuit package is disclosed which comprises a base (30) suitable for receiving an integrated circuit package with unformed leads (20') or formed leads (20), a cover (60), flexible materials (66), such as an elastomeric, disposed between the cover (60) and base (30) surfaces, and a means (40, 44, 68) for maintaining pressure across the cover (60) and base (30). The leads (22) of the integrated circuit package (20, 20') are thereby secured in position by the elastomeric material (66) which forms itself partially around each of the leads in response to pressure applied across the base (30) and cover (60) by the securing means (40, 44, 68). The disclosed invention eliminates the need for separate grooves or nests in the base (30) of the carrier and test device (10) for each lead of the integrated circuit package while providing a means to test the IC package while in the carrier and test device (10).

5 Claims, 3 Drawing Sheets

INTEGRATED CIRCUIT PACKAGE CARRIER AND TEST DEVICE

BACKGROUND OF THE INVENTION

The present invention relates to integrated circuit packages and more particularly to carriers for packaging, handling, and testing high-lead density electronic integrated circuit packages, such as an 180-lead gate array package.

Electronic integrated circuit (IC) packages, such as large scale integration (LSI) circuits, very large scale integration (VLSI) circuits, very high speed integrated circuits (VHSIC), and gate array circuits, are typically constructed with a large number of electrical leads. The leads eminate out from the body of the integrated circuit and are typically connected by a soldering process to a larger electronic unit, such as a wiring board or a printed circuit board. The printed circuit board is used to electrically connect several integrated circuits to cooperate in functioning together. Such a printed circuit board is installed in a unit of some electronics device, such as a radio, television, or radar system.

The complex configuration of electronics in modern integrated circuits results in a great number of electrical leads eminating from such circuits. In particular, a 180-lead gate array electronics package is an industry standard. The package is typically one and one-half inch on two sides and one inch on the other sides with as many as fifty-four leads eminating from each of two sides of the integrated circuit and as many as thirty-six leads eminating from each of the other two sides of the package. This results in a very high-lead density configuration, with lead spacings on the order of 0.030 inch centers.

In order to protect the integrated circuit packages from damage in handling and installing onto printed circuit boards, a protective device for the circuit package is required. Such device is intended to protect both the body of the integrated circuit from damage and the leads eminating from the body from breakage.

Moreover, in order to electrically test the integrated circuit requires placement of the circuit in cooperation with a performance board. Testing the circuit in as convenient manner possible prior to placing the circuit permanently on the printed circuit board is essential in order to avoid use of faulty integrated circuits.

One prior art approach to providing such lead protection for integrated circuit packages uses carriers having a separate groove or "nest" for each lead. Hughes Aircraft Company Part No. 821637 exemplifies a 42-lead package carrier and Hughes Aircraft Company Part No. 821638 exemplifies a 28-lead package carrier. These are one-piece construction integrated circuit carriers containing separate grooves or "nests" for each lead to rest in. With the current designs for high-lead density integrated circuits, and corresponding close lead spacings center-to-center (e.g., 0.030 inches, and to the extreme of 0.025 inches), carriers with separate grooves for each lead cannot be produced nor effectively utilized without major difficulties. Manufacture of carriers with high-density grooves is extremely impractical and costly, because the groove spacing is required to be extremely close. Devices in use also cause brittle electrical-wire leads to break or bend. Furthermore, one-piece construction carriers for integrated circuit packages presently in use do not lend themselves to the testing of high-lead density packages.

SUMMARY OF THE INVENTION

A primary objective of the present invention is to provide a unique combined carrier and test device which allows high lead count packages with close lead centers to be reliably tested within the carrier while assuming lead integrity and without utilizing the nesting concept.

Another object is to provide a unique combined carrier and test device which has flexible material such as an elastomeric connector material which automatically forms itself partially around each of the leads of an integrated circuit package so as to provide protection thereto, as well as providing a dedicated electrical circuit to each package lead.

A carrier and test device for an integrated circuit package in accordance with one embodiment of the subject invention comprises a base suitable for receiving an integrated circuit package such that the leads are extend over base support surfaces thereof; a cover having surfaces in alignment with the base support surfaces. The base support surface will be with openings through the base at the just mentioned base surface; elastomeric connector material disposed in the base openings and means for maintaining pressure across the cover and base surfaces. The elastomeric material comprises alternating segments of conductor and insulator material and when an integrated circuit package is suitably disposed between the base and cover the leads are secured in position by the elastomeric connector material which forms itself partially around each of the leads in response to the applied pressure and the elastomeric material protruding from the top of said cover is adapted for use in electrical testing of the integrated circuit.

A further aspect of the invention provides an device under test (D.U.T.) board having circuitry to match the pattern and density of the integrated circuit packages lead configuration, so that when the bottom is aligned on the D.U.T. board (carrier is installed with the base on the D.U.T. board) the elastomeric connector's electrical paths make contact with the circuitry on the D.U.T. board creating a unique electrical circuit to each package lead.

In accordance with the invention, the elastomeric connector is used as a seal ring to assure lead integrity by holding the leads of the integrated circuit package in place while preventing leads from shorting together. In addition it allows the package in either the formed or unformed lead configuration to be tested without removal from the carrier. This is accomplished by running the elastomeric connector completely through the base of the carrier so as to allow it to make contact with the leads being held between the top and base of the carrier. To test the IC package, the carrier is simply interfaced with a D.U.T. board having circuitry to match the lead density of the integrated circuit. The D.U.T. board is connected to a test performance board to provide test capability to circuitry associated with the performance board.

Devices in accordance with the subject invention eliminate the need to fit each integrated circuit lead into a separate groove for protective purposes by using the elastomeric connector as a seal ring. It also allows the IC package to be tested in the carrier in any lead configuration via direct interface. Hence, the invention allows high lead count packages with close lead centers to be reliably tested within an integrated circuit package carrier while assuring lead integrity without utilizing the nesting concept and without the need for multiple carriers/tooling. Novel relationships are set forth to demonstrate the general innovative approach. Other specific features and improvements are also disclosed.

BRIEF DESCRIPTION OF THE DRAWINGS

The novel features of this invention, as well as the invention itself, will be better understood from the accompanying description taken in connection with the accompanying drawings in which like reference characters refer like parts and in which.

DETAILED DESCRIPTION OF THE PREFERRED EMBODIMENTS

Figure 1:
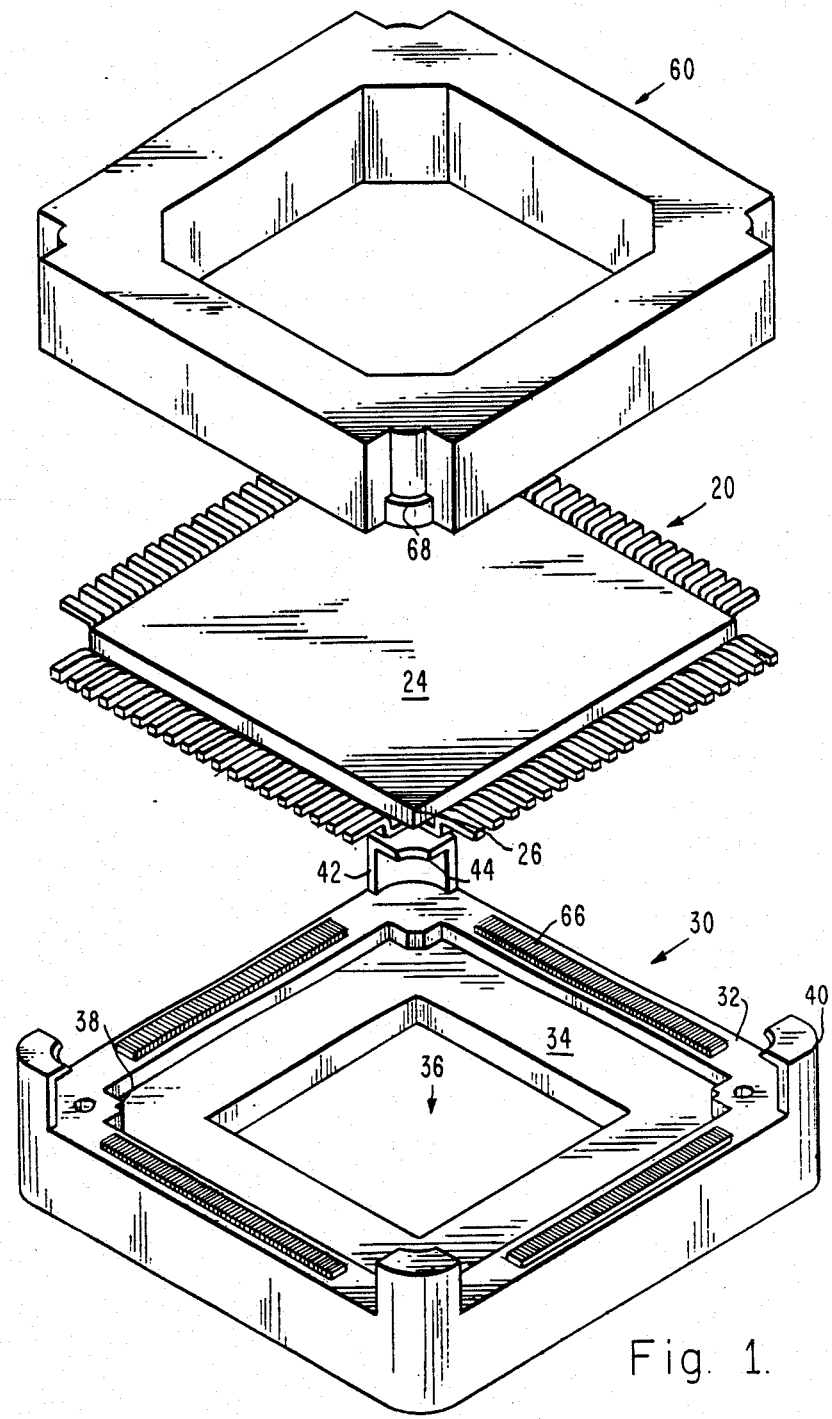
FIG. 1 is an exploded-view of an integrated circuit package carrier and test device showing a top perspective view of a cover (top portion of FIG. 1), a top perspective view of a base of an integrated circuit package carrier and test device (bottom portion of FIG. 1), and a top perspective view of an integrated circuit package having formed leads which is suitable for being carried by the carrier and test device in accordance with one subject invention.

As shown in the drawings, one embodiment of a carrier and test device for an integrated circuit package in accordance with the subject invention comprises a base 30 and a cover 60.

Figure 4:
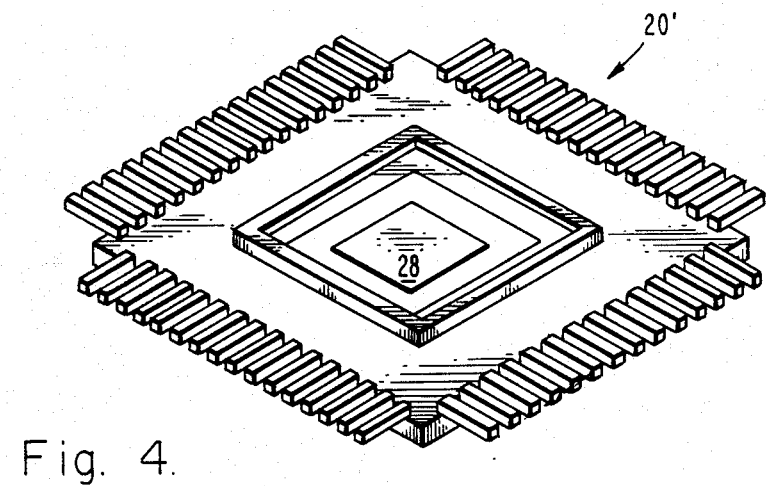
FIG. 4 is a top perspective view of an integrated circuit package having straight leads which is suitable for being carried by carriers in accordance with the subject invention.

Rectangular shaped base 30 is adapted for receiving integrated circuit package 20 such that its leads 22 are supported on a surface 32. An indentation or a recess in base 30, shown at 34, accommodates the body 24 of integrated circuit package 20 and an opening 36 is provided at the center of base 30. Notches 38 at each of the inner corners of base 30 mate with the corners 26 of integrated circuit package 20 so as to align the package to the base. It is noted that base 30 and cover 60 also accommodates the integrated circuit package 20' which has straight leads as shown in FIG. 4. In FIG. 4 the integrated circuit 28 is shown at the center of package 20'.

As shown in FIG. 1, clips are provided at each corner of the base 30 and comprise vertical members 42 with an orthogonal finger 44 at the top end thereof. Fingers 44 have sloping faces which tend to deflect the vertical member 42 outwardly during installation of cover 60.

Figure 2:
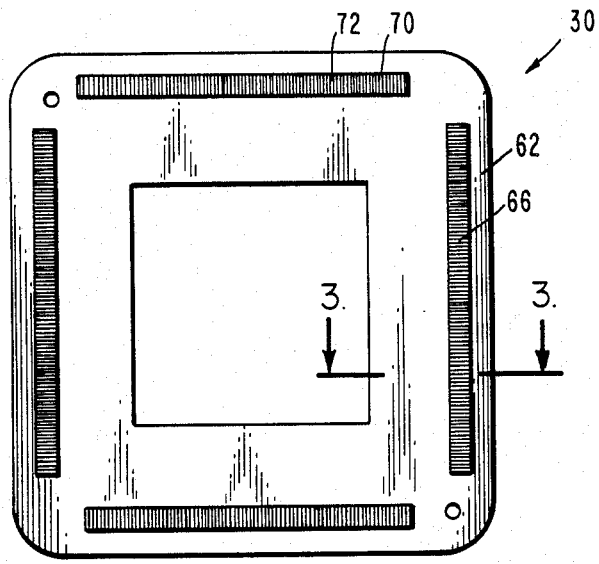
FIG. 2 is a bottom view of the base shown in FIG. 1.
Figure 3:
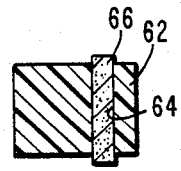
FIG. 3 is a vertical cross-sectional taken at 3—3 in FIG. 2.

As shown in FIGS. 2 and 3, surface 62 of base 30 has openings 64 formed therethrough and these openings would normally be longer than the width of the corresponding array of leads 22 from the integrated circuit package. Elastomeric connector material 66 is secured in openings 64 by a force fit or by adhesives, for example.

Cover 60 of FIG. 2 is generally rectangularly shaped to mate with support surfaces 32 of base 30 (FIG. 1). Each corner of cover 60 has a latching ledge 68 formed therein. Base 30 and cover 60 may be made from thermosetting plastic by injection molding, for example.

Elastomeric connector material 66 comprises alternating segments of a conductor material 70 and an insulator material 72, such connector material may be procured as silver stax connector from PCK Elastomerics, Inc. of Hatboro, Pa. For IC packages with 30 mils (thousands of an inch) between lead centers, for example, elastomeric material with two mils segments will ensure electrical contact with each lead while maintaining electrical isolation between the leads. Elastomeric material 66 extends sufficiently above the top of the base 30 (see FIG. 3) to cause it to slightly compress around the leads when the carrier is assembled. Also, elastomeric connector material 66 extends sufficiently below the bottom of base 30 so as to provide electrical connectors to the device under test board (D.U.T.) 80.

To use the integrated circuit package carriers in accordance with the subject invention the integrated circuit package 20 is mounted in recess 34 of base 30 and cover 60 is snapped into place. Finger 44 of clip 40 on the base engage the latching ledges 68 of cover 60. The dimensions of the various components are chosen such that when the base and cover are latched together sufficient pressure is maintained therebetween so that the elastomeric connector material is deformed partially around each of the leads 22 of integrated circuit package 20.

Figure 5:
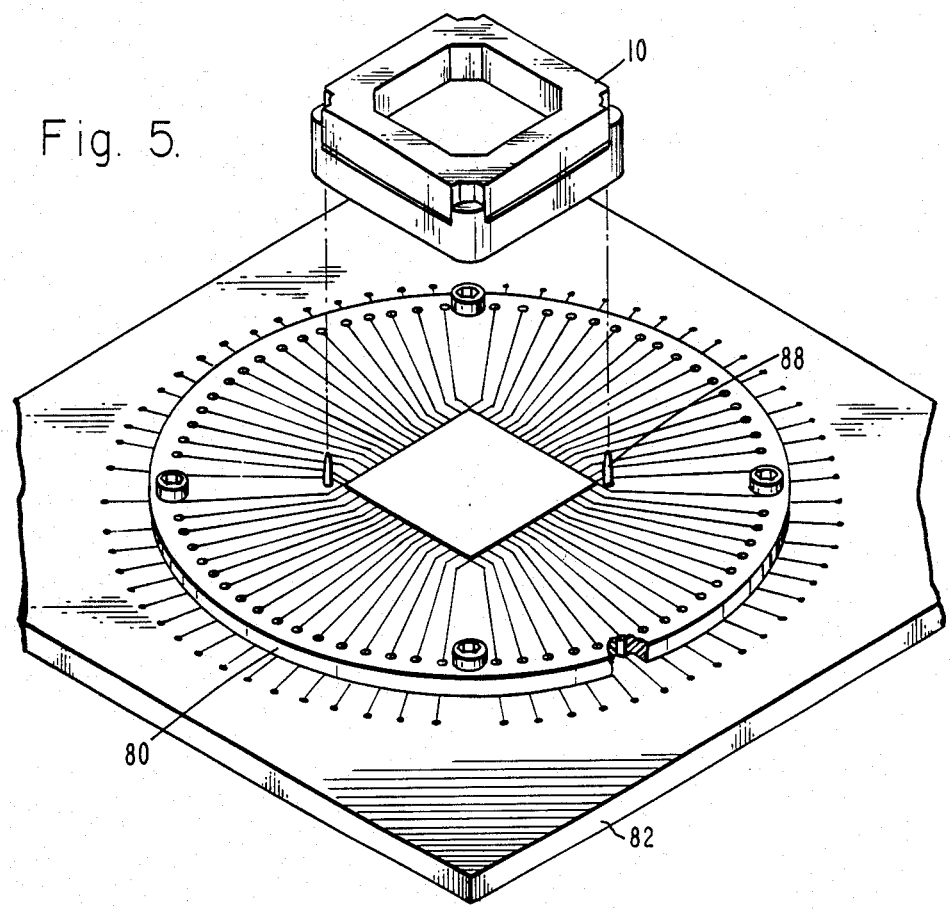
FIG. 5 is an exploded view of a carrier and test device, an associated D.U.T. board and performance board.

When base 30 and cover 60 are latched together elastometric conductor material 66 provides individual electrical paths from each lead of IC package 20 through the bottom of base 30. As shown pictorially in FIG. 5, carrier 10 is placed on device under test (D.U.T.) board 80 which includes an circuitry laid out to match the pattern and density of the IC package lead configuration with the use of two alignment pin 88. Elastomeric connector 66 conductor segments 70 make contact with the pattern on the D.U.T. board creating an electrical circuit to each package lead. The electrical circuits are utilized by other circuits (not shown) associated with the performance board for testing the IC package. It is noted that the lead spacing and circuit complexity shown in FIG. 5 is greatly simplified for clarity of explanation.

Figure 6:
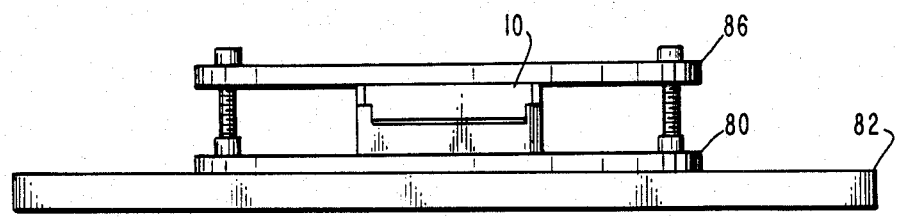
FIG. 6 a side view of a carrier and test device as secured onto a D.U.T. board in cooperation with a performance board. board in the test configurations.

As shown in FIG. 6, the carrier test device 10 is secured onto a D.U.T. board 80 in the test configuration. The top plate 86 is clamped on securely to provide a downward force on the carrier and test device 10 resulting in adequate contact of elastomers to the D.U.T. board 80.

Thus there has been provided an improved carrier and test device which allows high lead count packages with close lead centers to be readily tested within the carrier while assuming lead integrity and without utilizing the nesting concept.

What is claimed is:

1. A carrier for an integrated circuit package having protruding leads, said carrier comprising:
    a base suitable for receiving the integrated circuit package such that the leads extend over base support surfaces having openings therethrough;
    a cover having surfaces in alignment with said base support surfaces;

elastomeric connector material disposed in said openings in said base support surfaces and extending therethrough; and means for maintaining pressure across said cover and base;

whereby the leads of an integrated circuit package suitably disposed between said base and said cover are secured in position by the elastomeric connector material which forms itself partially around each of the leads in response to the pressure across said base and said cover and the elastomeric material protruding from the bottom of said base is adapted for use in electrical testing of the integrated circuit.

2. A carrier and test arrangement for an integrated circuit package having protruding leads, said carrier comprising:

a base suitable for receiving the integrated circuit package such that the leads are supported on surfaces thereof with openings through said base at said base surfaces;

a cover having surfaces in alignment with said base support surfaces;

elastomeric connector material disposed in said openings in said base and extending therethrough;

means for maintaining pressure across said cover and base; and a device under test board having circuitry to match the pattern and density of the integrated circuit package lead configuration, so that when the base is aligned on the device under test board the elastomeric connector electrical paths make contact with the circuitry on the device under test board creating a unique electrical circuit to each package lead.

3. The carrier and test arrangement of claim 2 wherein the width of said connector segments are such relative to the lead density that several conductor segments contact each lead and there are several insulator segments between each lead.

4. A carrier and test arrangement for an integrated circuit package having protruding leads, said carrier comprising:

a rectangular shaped base suitable for receiving the integrated circuit package such that the leads are supported on surfaces thereof with openings through said base at said base surfaces with notches at each of inner corners of said base to mate with corners of the integrated circuit package;

clips at each corner of said base comprising vertical members;

a cover with latching edges having surfaces in alignment with said base support surfaces;

elastomeric connector material disposed in said openings in said base and extending therethrough;

means for maintaining pressure across said cover base and by said clips of said base engaging said latching edges of said cover; and a device under test board having circuitry to match the pattern and density of the integrated circuit package lead configuration, so that when the base is aligned on the device under test board the elastomeric connector electrical paths make contact with the circuitry on the device under test board creating a unique electrical circuit to each package lead.

5. The carrier and test arrangement of claim 4 wherein said clips of said base have orthogonal fingers at the top end of said vertical members.

* * * * *